United States Patent [19]
Boyd et al.

[11] Patent Number: 5,362,669
[45] Date of Patent: Nov. 8, 1994

[54] METHOD OF MAKING INTEGRATED CIRCUITS

[75] Inventors: John M. Boyd, Woodlawn; Joseph P. Ellul; Sing P. Tay, both of Nepean, all of Canada

[73] Assignee: Northern Telecom Limited, Montreal, Canada

[21] Appl. No.: 80,544

[22] Filed: Jun. 24, 1993

[51] Int. Cl.$^5$ ............................................. H01L 21/76
[52] U.S. Cl. ...................................... 437/67; 437/62; 437/228; 148/DIG. 50
[58] Field of Search .......................... 437/67, 62, 228; 148/DIG. 50

[56] References Cited

U.S. PATENT DOCUMENTS

| | | | |
|---|---|---|---|
| 4,255,207 | 3/1981 | Nicolay et al. | 156/647 |
| 4,396,460 | 8/1983 | Tamaki et al. | 437/67 |
| 4,570,330 | 2/1986 | Cogan | 156/662 |
| 4,671,851 | 6/1987 | Beyer et al. | 437/67 |
| 4,740,480 | 4/1988 | Ooka | 437/67 |
| 4,836,885 | 6/1989 | Breiten et al. | 437/67 |

FOREIGN PATENT DOCUMENTS 0159258 7/1991 Japan ..................... 437/67

OTHER PUBLICATIONS

"Method for producing planarized polysilicon filled trenches" 2244 Research Disclosure (1989) Oct., No. 306.

Primary Examiner—Brian E. Hearn
Assistant Examiner—Trung Dang
Attorney, Agent, or Firm—Angela C. de Wilton

[57] ABSTRACT

A method is provided for forming a fully planarized trench isolated region in a semiconductor substrate for an integrated circuit, for example, a trench isolated field oxide region, or a trench isolated semiconductor region in which thin film semiconductor devices are formed. Planarization is accomplished by a chemical mechanical polishing process in which coplanar layers of a chemical mechanical polish resistant material are provided in a centre region of wide trenches as well as on the semiconductor substrate surface adjacent the trenches. The chemical mechanical polish resistant layer in the centre region of a wide trench forms an etch stop to prevent dishing of layers filling the trench during overall wafer planarization by chemical mechanical polishing. The method is compatible with CMOS, Bipolar and Bipolar CMOS processes for submicron VLSI and ULSI integrated circuit structures.

5 Claims, 2 Drawing Sheets

METHOD OF MAKING INTEGRATED CIRCUITS

FIELD OF THE INVENTION

This invention relates to a method of making integrated circuits, with particular application to planarization by chemical mechanical polishing.

BACKGROUND OF THE INVENTION

In fabrication of VLSI and ULSI integrated circuits, the use of fully recessed isolation, such as a process known as the "shallow trench" technique, has been used in submicron manufacturing processes to reduce surface topography related process problems associated with non-planar surfaces.

A typical structure would be formed in the following manner:
1. patterning and etching trenches in the field areas;
2. passivating and filling the trenches with a dielectric material, typically an oxide, e.g. silicon dioxide; and
3. planarizing the wafer surface.

There are numerous known methods of planarizing wafers during fabrication of integrated circuits, for example, block resist and resist etch back, block resist and spin on glass. A promising and simple method of choice is chemical mechanical polishing (CMP). CMP provides full wafer planarization without additional masking or coating steps. However, one of the difficulties encountered with CMP for trench planarization is the "dishing" effect which occurs in wide trenches (i.e. ~30 $\mu$m), typical of a fully recessed field structure. "Dishing" is particularly severe in trenches wider than 100 $\mu$m and the "dishing" effect during polishing results in thinning of the dielectric in wide trenches only, and much effort has been directed to modify the polish process, equipment and materials attempt to reduce and control the dishing effect.

SUMMARY OF THE INVENTION

The present invention seeks to provide a method of forming integrated circuits including planarization using chemical mechanical polishing, which avoids the above-mentioned problem.

According to one aspect of the present invention, there is provided a method of fabricating an integrated circuit, comprising: providing a semiconductor substrate having a planar surface and comprising a surface layer of a chemical mechanical polish resistant material, the substrate having defined therein a steep sided trench filling the trench with at least one conformal layer of a trench filling material and a conformal layer of chemical mechanical polish resistant material, the layer of chemical mechanical polish resistant material within the trench providing, in a centre region of the trench, a polish stop having a surface coplanar with the surface layer of chemical mechanical polish resistant material of the semiconductor substrate; and planarizing the resulting structure by chemical mechanical polishing, thereby selectively removing layers extending above the planar surface of the substrate and the coplanar surface of the polish stop in the centre region of the trench.

Thus dishing of the trench filling layers within wider trenches during chemical mechanical polishing is avoided by providing a chemical mechanical etch stop within wider trenches. Preferably, the layer of chemical mechanical polish resistant material forming the polish stop in the centre region of the trench having a thickness equal to the thickness of the surface layer of chemical mechanical polish resistant material of the substrate, so that after removing the chemical mechanical polish resistant layers, a fully planarized substrate surface is provided in which is defined fully recessed trench isolation regions.

According to another aspect of the present invention there is provided a method of fabricating an integrated circuit, comprising: providing a semiconductor substrate having a surface and having formed thereon a chemical mechanical polish stop layer and an overlying dielectric layer, the substrate having defined therein a steep sided trench; providing a conformal layer of a trench filling material overall extending over the surface of the first dielectric adjacent the trench and filling the trench, the thickness of the conformal trench filling layer being sufficient to fill a centre of the trench coplanar with the surface of the semiconductor substrate; providing overall an overlying conformal layer of a second chemical mechanical polish stop layer, whereby surfaces of parts of the first polish stop layer on the substrate surface and part of the second polish stop layer in the centre of the trench are coplanar; and planarizing the resulting structure by selectively removing layers of the second dielectric and second polish stop layer extending over the surfaces of the parts of the first and second polish stop layers coplanar with the surface of the semiconductor substrate.

Preferably, the conformal trench filling layer comprises a first conformal layer of a dielectric material and a second conformal layer of a semiconductor material so that after the step of planarizing by chemical mechanical polishing, a trench isolated semiconductor well region is provided in selected trenches. Fully recessed trench isolation may be provided in the same process steps. Subsequently, fully embedded structures such as thin film transistors and MOS transistors may be defined, by conventional processing steps, in the trench isolated semiconductor well region and the semiconductor substrate, respectively. Advantageously, coplanar contacts may then be provided to a plurality of devices.

Consequently self-aligned embedded planar device structures may be provided without additional photolithographic masking steps. Trench isolated structures for complex analog BiCMOS, CMOS and Bipolar circuits may be fabricated with a reduced number of mask levels and process steps.

Thus, there is provided a method of forming an integrated circuit, in which the above-mentioned problem is avoided or reduced.

BRIEF DESCRIPTION OF THE DRAWINGS

Embodiments of the invention will now be described by way of example, with reference to the accompanying drawings, in which.

DESCRIPTION OF THE PREFERRED EMBODIMENT

Figure 1:
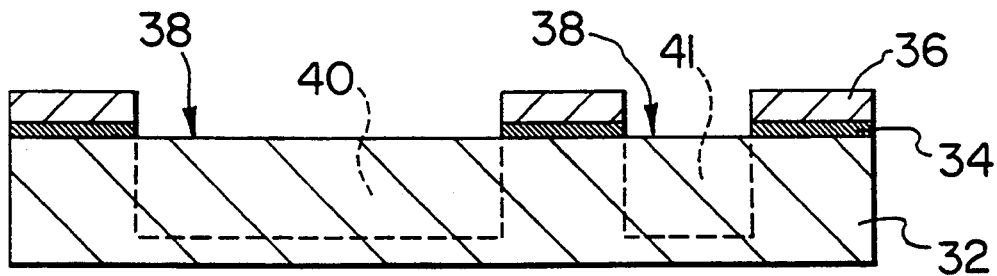
FIGS. 1 to 3 show schematic cross-sectional views of part of a partially fabricated integrated circuit structure at successive stages in forming a trench isolation region according to a first embodiment of the present invention.

In a method of forming an integrated circuit according to a first embodiment of the present invention, a substrate for an integrated circuit is provided in the form of a P type, <100> semiconductor silicon wafer 32, as shown in FIG. 1. The substrate wafer is provided with a first layer 34 of a chemical mechanical polish (CMP) resistant material, e.g. a layer of silicon nitride, silicon carbide, boron nitride, or other suitable CMP resistant material to form a polish stop, and an overlying layer 36 of a dielectric material, e.g. silicon dioxide.

Trench isolation regions 38 are defined on the substrate, e.g. by a conventional photoengraving step involving coating with photoresist, and patterning. Steep sided trenches 40 and 41, are etched in the substrate 32 by a conventional known method of anisotropic etching.

Figure 2:
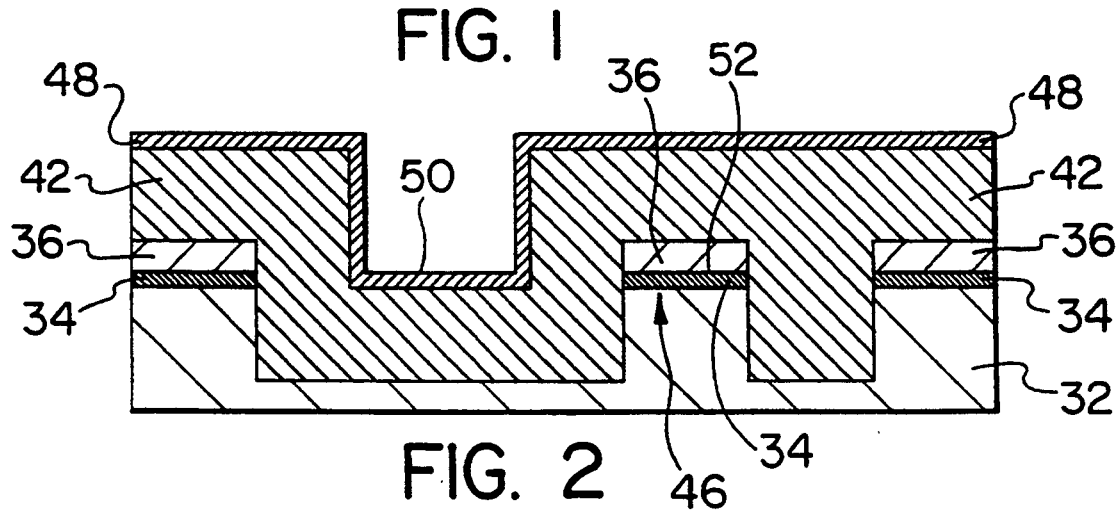

Subsequently a conformal layer 42 of a dielectric material is deposited overall to fill the trenches 40 and 41 (FIG. 2). The dielectric comprises for example a conformal layer of CVD silicon dioxide. The thickness of the layer 42 is just sufficient to fill the wider trench 41 level with the substrate surface layer 46, and completely fills the narrower trenches 41. The second dielectric layer 42 extends over the first dielectric layer 36 adjacent to the trenches (FIG. 2).

Then, a second layer 48 of a chemical mechanical polish resistant material is deposited conformally overall. The thickness of the second CMP resistant layer 48 is the same as that of the first CMP resistant layer 34, so that the surface 50 of the second CMP resistant layer 48 in the centre of the wide trench is coplanar with the surface 52 of the first polish resistant layer 34 provided on the semiconductor substrate surface 46.

The resulting structure is then planarized by selectively removing parts of the trench filling layers by chemical mechanical polishing with a suitable known chemical mechanical polishing slurry. The layers removed during chemical mechanical polishing include parts of the second dielectric layer 42, and the second polish resistant layer 48, which extend above surfaces 50 and 52 of the parts of the first and second polish resistant layers which are coplanar with the surface of the semiconductor substrate 46.

Figure 3:
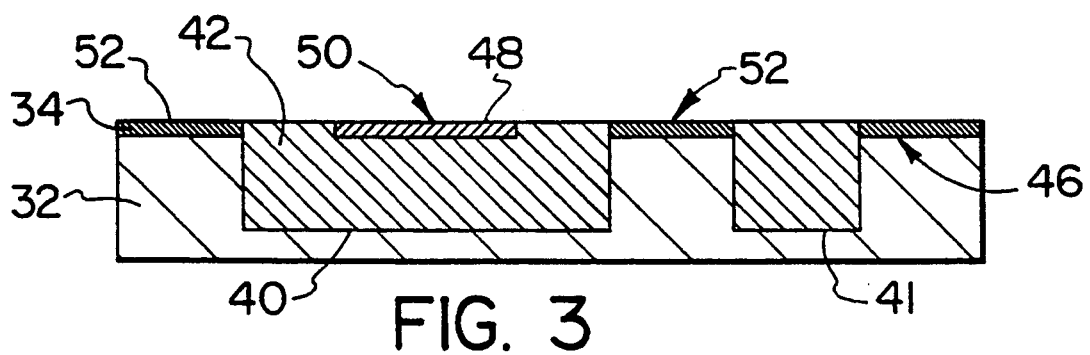
Figure 4:
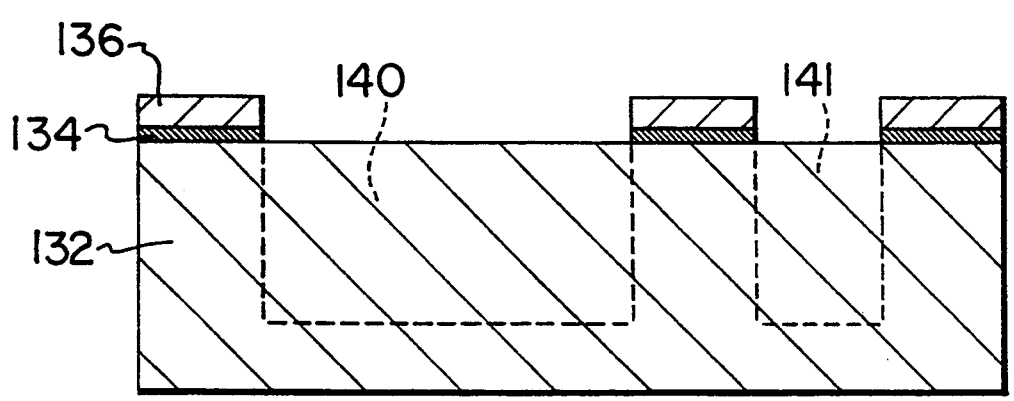
FIGS. 4 to 7 show schematic cross-sectional views of part of a partially fabricated integrated circuit structure at successive stages in forming a trench isolated region according to a second embodiment of the present invention.
Figure 5:
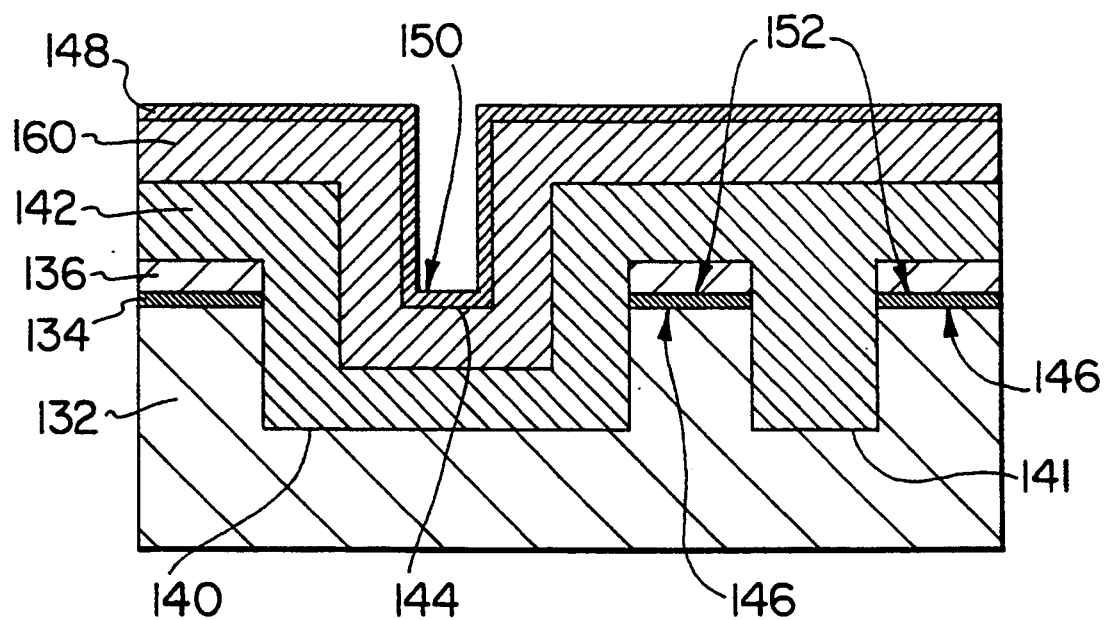
Figure 6:
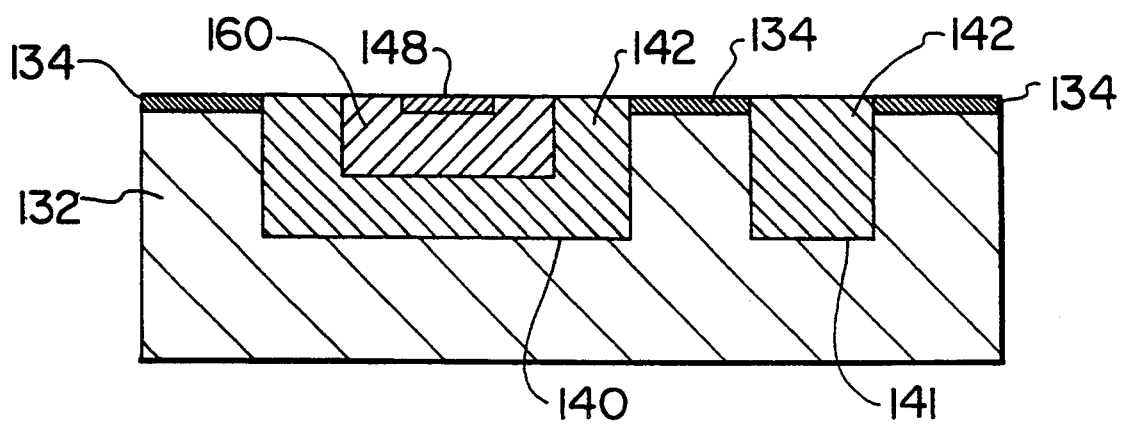

Etching back by a chemical mechanical polishing process provides a fully planarized surface as shown in FIG. 3. The surface of first and second silicon nitride layers 52 and 50, on the surface of the substrate and in the trench provide coplanar stop layers to prevent dishing during polishing of the dielectric layer 42 filling the wider trench 40.

The parts of the polish stop layers 50 and 52 on the substrate surface are then selectively removed down to the level of the semiconductor substrate surface, if required.

Typically, trench dielectric isolation layers comprise 0.5 to 0.7 $\mu$m of a layer of dielectric such as silicon dioxide which may be formed by chemical vapour deposition, or by a composite process including a step of thermal oxidation preceding or following a deposition process. A layer of silicon nitride, about 400 Å thick provides a suitable chemical mechanical polish resistant layer. Other polish stop materials include, for example, silicon carbide and boron nitride.

In a method of forming an integrated circuit according to another embodiment, as shown in FIGS. 4 to 7, a substrate 132 is provided, as in the first embodiment, having steep sided trenches 140, 141 defined therein. The substrate comprises a surface layer 134 of a chemical mechanical polish resistant layer on the substrate surface 146 and an overlying layer of dielectric 136. The trenches 140, 141 are filled by a plurality of conformal layers, for example, a first layer 142 of dielectric, and a second layer 160 of a semiconductor material, for example, doped polysilicon for forming a trench isolated device well region. As in the first embodiment the trench filling layers fill a centre region of the trench 140 level with the substrate surface 146, and a conformal layer of a polish resistant material is then deposited to form the polish stop 150, in the centre of the wider trench, which has a surface coplanar with the surface 152 of the polish stop layer on the substrate surface, as described in the first embodiment. However, the narrower trench 141 is completely filled by the isolation layer 142. After planarization by chemical mechanical polishing, a fully planarized structure is provided (FIG. 6) having a trench isolated polysilicon device well region 162 and a dielectric filled trench isolation region 164.

In forming the structure described above, the trench may be filled, for example, with dielectric layer 142, about 0.5 $\mu$m thick, and layer of polysilicon, about 0.1 to 0.3 $\mu$m thick. The polish stop layer, for example, is a layer of silicon nitride about 400 Å thick. The polish stop layer may be selectively removed after planarization to allow further processing for device fabrication.

Figure 7:
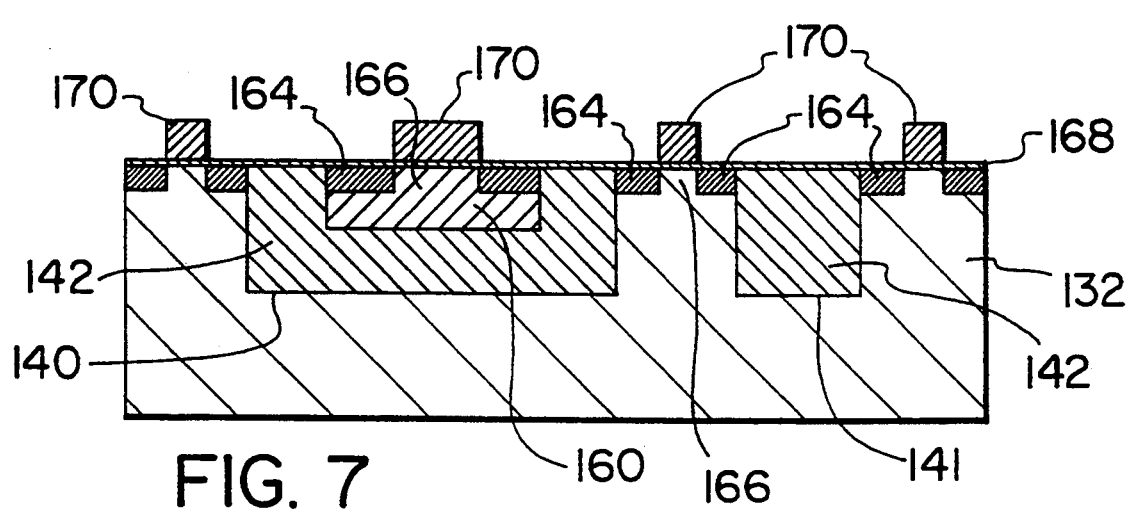

Subsequently devices are formed by known process steps within the well region and in the semiconductor substrate, as shown in FIG. 7. For example polysilicon thin film transistors, and buried resistors, may be provided in a process simultaneously with formation of MOS transistors formed in silicon substrate. As shown in FIG. 7 after defining source, drain 164 and channel 166 regions of transistors in the fully planarized surface of both the trench isolated polysilicon region 160 and the silicon substrate 132, a thin dielectric layer 168, i.e. a gate oxide layer, is provided overall. Then an overlying layer of a conductive layer 170, e.g. of polysilicon, is deposited and patterned to define gate electrodes. These process steps, and subsequent metallization steps, are thus simplified by the fully planarized topography. Coplanar contacts are provided to both resistor electrodes and to both source and drain electrodes of the thin film transistor.

Thus a method is provided for forming self-aligned embedded planar structures such as polysilicon transistors or high resistivity resistors, without additional photo-lithographic masking steps.

Other applications of fully recessed trench isolated structures include formation of buried conductors, for example, for local interconnect conductors, dc rails, and polysilicon fuses.

Thus trench isolated structures for complex analog BiCMOS, CMOS and Bipolar circuits may be fabricated with a reduced number of mask levels and process steps, to reduce processing costs.

Although particular embodiments of the invention have been described in detail, it should be appreciated that numerous modifications, variations and adaptations may be made without departing from the scope of the invention as defined in the claims.

What is claimed is:

1. A method of fabricating an integrated circuit, comprising:

providing a semiconductor substrate having a planar surface and comprising a surface layer of a chemical mechanical polish resistant material, the substrate having defined therein a steep sided trench;

filling the trench with at least one conformal layer of a trench filling material and a conformal layer of chemical mechanical polish resistant material, the layer of chemical mechanical polish resistant material within the trench providing, in a centre region of the trench, a polish stop having a surface coplanar with the surface layer of chemical mechanical polish resistant material of the semiconductor substrate; and planarizing the resulting structure by a step of chemical mechanical polishing to remove all parts of each of the layers extending above the surface layer of chemical mechanical polish resistant material of the substrate and the coplanar surface of the polish stop in the centre region of the trench, whereby the polish stop in the centre region of the trench prevents dishing of the trench filling material.

2. A method according to claim 1 comprising providing said layer of chemical mechanical polish resistant material forming the polish stop in the centre region of the trench having a thickness equal to the thickness of the surface layer of chemical mechanical polish resistant material of the substrate.

3. A method of fabricating an integrated circuit, comprising:

providing a semiconductor substrate having a surface and having formed thereon a first chemical mechanical polish stop layer and an overlying first dielectric layer, the substrate having defined therein a steep sided trench;

providing a conformal layer of a trench filling material overall extending over the surface of the first dielectric adjacent the trench and filling the trench, the thickness of the conformal trench filling layer being sufficient to fill a centre of the trench coplanar with the surface of the semiconductor substrate;

providing overall an overlying conformal layer of a second chemical mechanical polish stop layer, whereby surfaces of parts of the first polish stop layer on the substrate surface and a part of the second polish stop layer in the centre of the trench are coplanar; and planarizing the resulting structure by chemical mechanical polishing to remove all parts of each layer extending above said coplanar surfaces of said parts of the first and second polish stop layers whereby the second polish stop layer in the centre of the trench prevents dishing of the trench filling material.

4. A method according to claim 3 comprising a subsequent step of selectively removing the polish stop layers leaving a fully planarized surface coplanar with the substrate surface.

5. A method according to claim 3 wherein providing the conformal trench filling layer comprises:

depositing a first conformal layer of a dielectric material and then depositing a second conformal layer of a semiconductor material whereby after the step of planarizing, a trench isolated semiconductor well region is provided.

* * * * *